US006403995B2

(12) United States Patent
Thomas

(10) Patent No.: US 6,403,995 B2
(45) Date of Patent: Jun. 11, 2002

(54) SEMICONDUCTOR DIGITAL LOUDSPEAKER ARRAY

(75) Inventor: David R. Thomas, Opio (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/862,069

(22) Filed: May 21, 2001

Related U.S. Application Data

(60) Provisional application No. 60/207,488, filed on May 26, 2000.

(51) Int. Cl.[7] .............................................. H01L 27/148

(52) U.S. Cl. ........................................ 257/249; 257/245

(58) Field of Search ............................ 257/494, 32, 37, 257/119, 245, 249; 310/334, 311; 367/163; 29/25.35

(56) References Cited

U.S. PATENT DOCUMENTS

| | | | | | |
|---|---|---|---|---|---|
| 4,427,913 | A | * | 1/1984 | Iafrate et al. | 310/334 |
| 4,590,399 | A | * | 5/1986 | Roxlo et al. | 310/334 |
| 4,749,900 | A | * | 6/1988 | Hadimioglu et al. | 310/334 |
| 5,381,386 | A | * | 1/1995 | Lum et al. | 367/163 |
| 5,596,239 | A | * | 1/1997 | Dydyk | 310/311 |
| 5,884,378 | A | * | 3/1999 | Dydyk | 29/25.35 |
| 6,140,690 | A | * | 10/2000 | Oka et al. | 257/494 |

* cited by examiner

*Primary Examiner*—David Nelms
*Assistant Examiner*—Bau T Le
(74) *Attorney, Agent, or Firm*—J. Dennis Moore; W. James Brady, III; Frederick J. Telecky, Jr.

(57) ABSTRACT

A high performance unary digital loudspeaker system is disclosed; providing cost-effective and efficient performance, and providing the option to integrate multiple speaker elements or other related circuitry, and comprising a semiconductor substrate (102), an electrode (104) disposed upon the substrate, an insulator element (106) disposed upon the electrode forming a frame of material, an electrically conductive membrane (108) disposed upon the insulator element so as to form a chamber (110) between the electrode and the membrane, the membrane having a flexible support section (112) formed therein, and a control circuit (200) coupled (114, 116) to the membrane and the electrode, and adapted to provide a variable potential therebetween.

20 Claims, 1 Drawing Sheet

SEMICONDUCTOR DIGITAL LOUDSPEAKER ARRAY

This application claims priority under 35 USC §119(e)(1) of provisional application Ser. No. 60/207,488, filed May 26, 2000.

FIELD OF THE INVENTION

This invention relates in general to audio circuitry and, more particularly to an effective and efficient way of producing an array of unary digital speakers on a semiconductor substrate.

BACKGROUND OF THE INVENTION

Conventional analog loudspeakers generally rely on the motion of a diaphragm stimulated by some type of motor to reproduce a desired sound. All, or part, of the diaphragm is stimulated in correspondence to an analog electrical signal, typically representing the instantaneous sound pressure that a listener should hear. Analog loudspeakers typically suffer a number of inherent limitations involving, for example, high frequency distortion, non-linearity, and poor power efficiency. Although some solutions have attempted to address these limitations, such solutions have introduced problems of their own, such as non-uniform frequency response, imbalance, phase distortions, power loss and reduction, and increased costs and complexity. Thus, generally, analog loudspeakers have been considered highly inefficient.

The prevalence of high quality digital audio material, and trends in electronic equipment to minimize power consumption for miniaturization and operation from small batteries, have rendered analog loudspeakers somewhat inadequate. Also, conventional analog systems typically require a digital to analog converter (DAC) at some point in the system for the reproduction of digital source material. DACs introduce noise and distortion that adds to that already present in the system, and also add extra cost.

Previously, attempts were made to develop binary digital loudspeakers overcoming the limitations of analog loudspeakers. Such binary digital loudspeakers typically produced marginal improvement over analog systems, but still suffered to some extent from all the limitations previously described, and in some cases introduced further limitations and costs. Many such attempts relied on ratiometric division of a diaphragm or coil turns to correspond to digital bit patterns. These systems suffered from problems with precision and skew resulting in undesired transients and added distortion.

Most conventional digital loudspeaker systems have assumed that binary digital code was the digital signal medium from the input of the device through to the output transducers. Such systems typically suffer from switching transient problems or level change errors, affecting system accuracy and causing large distortion components. Attempts to address such complications with extreme mechanical precision result in high manufacturing costs, and may not achieve the precision required.

Still further attempts were made to produce unary digital loudspeakers, overcoming some of the problems associated with and having higher electrical to sound efficiency than conventional binary digital loudspeakers, and requiring less mechanically accurate speaker structures. Conventional unary speakers generally have a characteristic of being fully "on" when any voltage or current pulse was applied to the speaker, or fully "off" in the absence of any pulse. Typically, conventional unary speaker systems or arrays required a large number of speakers or speaker elements. These approaches were inefficient from both a size and performance perspective. Other conventional systems utilizing piezoelectric transducers and conventional mechanical components commonly utilized separate speakers and drive circuits, reducing system performance and increasing system costs.

SUMMARY OF THE INVENTION

Therefore, a high performance unary digital loudspeaker system designed without conventional mechanical structures is now needed; providing cost-effective and efficient performance, and providing the option to integrate multiple speaker elements or other related circuitry, while overcoming the aforementioned limitations of conventional methods.

The present invention provides a unary semiconductor digital loudspeaker comprising a substrate, an electrode disposed upon the substrate, an insulator disposed upon the electrode, and an electrically conductive membrane disposed upon the insulator and forming a chamber between the electrode and membrane.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and the use of the present invention is discussed in detail below, it should be appreciated that the present invention provides many applicable inventive concepts which can be embodied in a wide variety of specific contexts. The specific embodiments discussed herein are merely illustrative of specific ways to make and use the invention, do not delimit the scope of the invention.

Figure 1:
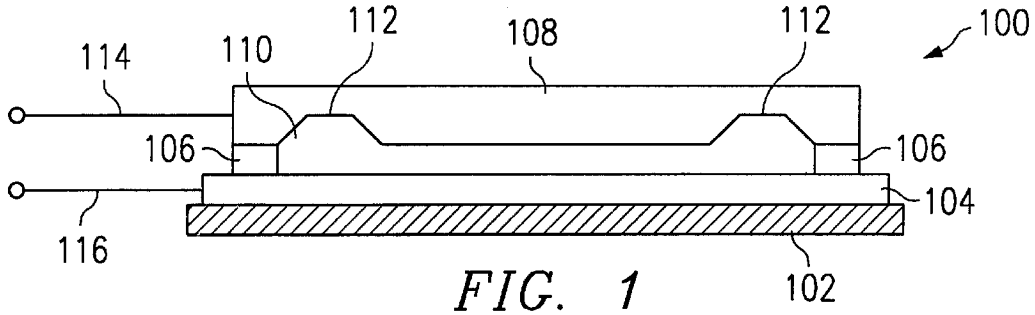
FIG. 1 is an illustrative diagram of an embodiment of the present invention.

The present invention recognizes that, using certain semiconductor processing technology, one can produce high performance digital loudspeakers without relying on problematic conventional mechanical structures. Referring now to FIG. 1, a digital speaker system 100 according to the present invention is depicted. System 100 comprises a substrate 102, a bottom electrode member 104, insulator elements 106, and membrane member 108. Electrode 104 may comprise metal or other suitable electrically conductive material, and is attached or coupled to substrate 102 using available semiconductor processing (e.g. deposition). Elements 106 comprise an electrically insulating or non-conductive material, and are disposed upon electrode 104 with in a spatially separate relationship. Alternatively, element 106 may comprise a single contiguous frame-like structure of material disposed upon electrode 104, shaped to support membrane 108. Membrane 108 is suspended over electrode 104 by elements 106, and elements 106 are so configured, such that chamber 110 is formed between membrane 108 and electrode 104. Membrane 108 is formed of electrically conductive material, such as metal. Chamber 110 may be either a vacuum or low-pressure cavity. Chamber 110 thus have very little resistance to movement of membrane 108, resulting in high electrical to audio efficiency. Membrane 108 is formed such that flexible support sections 112 adjoin the inner surface of membrane 108 around the perimeter of chamber 110 with the insulators 106, providing stable flexion and movement of membrane 108. Each support 112 may comprise an integral recess formed in membrane 108, or may comprise a separate component coupled jointly to membrane 108 and insulator 106. Leads 114 and 116 couple membrane 108 and electrode 104, respectively, to control circuitry. Using such control circuitry to apply a voltage between membrane 108 and electrode 104, one can efficiently move membrane 108 in relation to electrode 104, providing the fully on/fully off characteristics required of a unary digital speaker without the limitations inherent in prior approaches.

Figure 2:
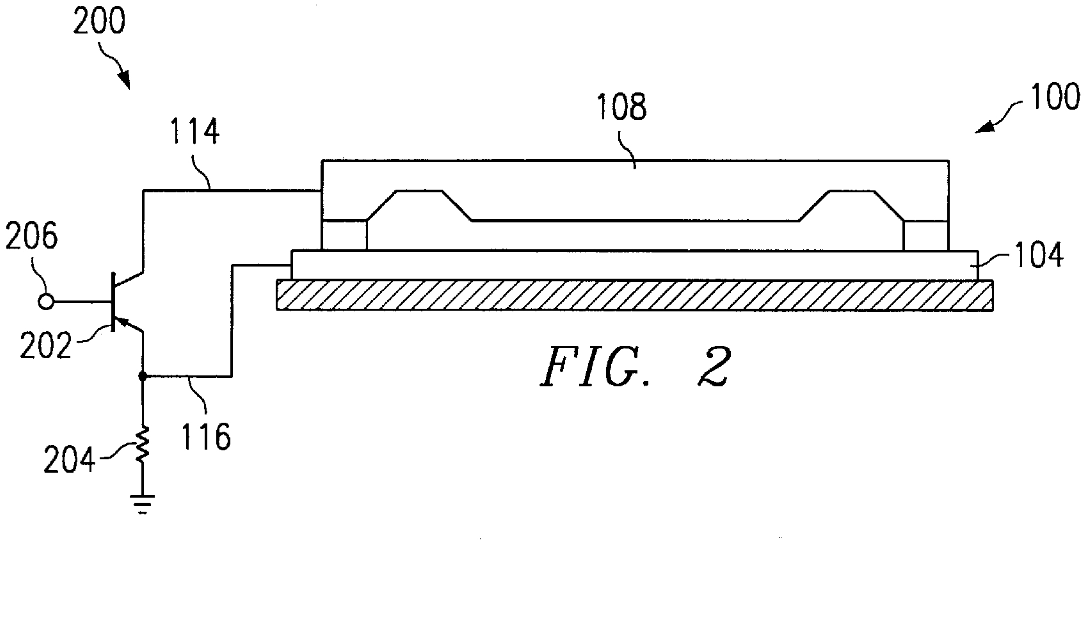
FIG. 2 is an illustrative diagram of another embodiment of the present invention.

Assembly 100 can be formed using any suitable semiconductor processes, alone or in combination, such as silicon micro machining techniques, multi-step mask processes, deposition or etching. Utilizing the design of the present invention, one may efficiently produce an array of unary speakers on a single substrate. One might also incorporate related circuitry, such as the circuitry necessary to control the voltage applied to the individual speakers, or other decode logic necessary to determine which speaker(s) should be activated at a given time. The present invention thus requires lower interconnect overhead than previous approaches, providing higher system reliability, reduced drive current and lower power consumption. FIG. 2 depicts one such example, wherein assembly 100 is coupled to a control circuit 200.

As depicted in FIG. 2, control circuit comprises a transistor 202 and a resistor 204. The base of transistor 202 is coupled to an input 206, the collector of transistor 202 is coupled to lead 114, and the emitter of transistor 202 is coupled jointly to a first end of resistor 204 and to lead 116. A second end of resistor 204 is coupled to ground. Voltage at input 206 may be adjusted to vary the potential between membrane 108 and electrode 104, producing desired sound waves.

Utilizing the design of the present invention, one may also efficiently interconnect a number of integrated array elements to form a speaker array of any desired size. The present thus provides means to efficiently construct a single chip audio unit (e.g. fully integrated hearing aid or active noise canceling ear plugs). The use of semiconductor process construction provides significant cost advantages over previous separate mechanical electrical processing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The teachings and concepts of the present invention may be applied using a variety of semiconductor processes, or to produce a variety of acoustic components and systems. Thus, the principles of the present invention are practicable in a number of applications and technologies. It is therefore intended that the appended claims encompass any such modifications or embodiments.

What is claimed is:

1. A unary digital speaker comprising:

a substrate;

a first electrically conductive member disposed upon the substrate;

an electrically non-conductive element disposed upon the first electrically conductive member;

a second electrically conductive member disposed upon the non-conductive element so as to form a chamber between the first and second electrically conductive members.

2. The speaker of claim 1 wherein the substrate is a semiconductor substrate.

3. The speaker of claim 1 wherein the non-conductive element comprises a plurality of pieces.

4. The speaker of claim 1 wherein the non-conductive element comprises a single frame of material.

5. The speaker of claim 1 further comprising a flexible support section adjoining the second electrically conductive member with the non-conductive element.

6. The speaker of claim 5 wherein the flexible support section is an independent structure jointly coupled to the second electrically conductive member and the non-conductive element.

7. The speaker of claim 5 wherein the flexible support section is formed within the second electrically conductive member.

8. The speaker of claim 1 wherein the first electrically conductive member is formed of metal.

9. The speaker of claim 1 wherein the second electrically conductive member is formed of metal.

10. The speaker of claim 1 wherein the chamber comprises a vacuum.

11. The speaker of claim 1 wherein the chamber comprises a low pressure cavity.

12. A method of producing a unary digital speaker comprising the steps of:

providing a substrate;

disposing a first electrically conductive member upon the substrate;

disposing an electrically non-conductive element upon the first electrically conductive member;

disposing a second electrically conductive member upon the non-conductive element, forming a chamber between the first and second electrically conductive members.

13. The method of claim 12 wherein the step of providing a substrate further comprises providing a semiconductor substrate.

14. The method of claim 12 wherein the step of disposing an electrically non-conductive element further comprises forming the electrically non-conductive element from a plurality of pieces.

15. The method of claim 12 wherein the step of disposing an electrically non-conductive element further comprises forming a single frame of material.

16. The method of claim 12 further comprising the step of providing a flexible support section adjoining the second electrically conductive member with the non-conductive element.

17. The method of claim 16 wherein the flexible support section is formed within the second electrically conductive member.

18. The method of claim 12 wherein the forming of a chamber further comprises forming a vacuum.

19. The method of claim 12 wherein the forming of a chamber further comprises forming a low pressure cavity.

20. A semiconductor digital loudspeaker array comprising:

a semiconductor substrate;

an electrode disposed upon the substrate;

an insulator element disposed upon the electrode forming a frame of material;

an electrically conductive membrane disposed upon the insulator element so as to form a low pressure chamber between the electrode and the membrane, having a flexible support section formed therein; and a control circuit coupled to the membrane and the electrode, and adapted to provide a variable potential therebetween.

* * * * *